(12) United States Patent
Shiroishi et al.

(10) Patent No.: US 8,358,512 B2
(45) Date of Patent: Jan. 22, 2013

(54) ELECTRONIC DEVICE

(75) Inventors: Toshikazu Shiroishi, Hamura (JP);
Tomohiro Hamada, Tachikawa (JP);
Toshio Konno, Akiruno (JP); **Kohei
Wada, Tachikawa (JP); Ryosuke Saito**,
Kodaira (JP)

(73) Assignee: Kabushiki Kaisha Toshiba (JP)

( * ) Notice: Subject to any disclaimer, the term of this patent is extended or adjusted under 35 U.S.C. 154(b) by 141 days.

(21) Appl. No.: 12/853,126

(22) Filed: Aug. 9, 2010

(65) Prior Publication Data
US 2011/0122595 A1 May 26, 2011

(30) Foreign Application Priority Data
Nov. 25, 2009 (JP) .................. 2009-267822

(51) Int. Cl.
*H05K 7/14* (2006.01)
*H05K 7/18* (2006.01)
(52) U.S. Cl. .................. 361/799; 361/816; 361/818
(58) Field of Classification Search .................. 361/800, 361/816, 818, 799; 174/35 R, 51, 350, 377
See application file for complete search history.

(56) References Cited

U.S. PATENT DOCUMENTS

| 5,764,492 | A  | * | 6/1998  | Ady et al. .................... 361/818 |
| 6,101,088 | A  | * | 8/2000  | Nakajima et al. ......... 361/679.55 |
| 6,138,347 | A  | * | 10/2000 | Persson et al. .................. 29/836 |
| 6,538,197 | B1 | * | 3/2003  | Kawai ............................ 174/363 |
| 7,164,577 | B2 | * | 1/2007  | Minaguchi et al. ....... 361/679.33 |
| 7,636,244 | B2 | * | 12/2009 | Kriege et al. ................. 361/800 |
| 8,199,524 | B2 | * | 6/2012  | Chikazawa et al. ........... 361/799 |
| 2008/0150811 | A1 | | 6/2008  | Honda et al. |

FOREIGN PATENT DOCUMENTS

| JP | 60-179097 | 11/1985 |
| JP | H09-102681 | 4/1997 |
| JP | H09-331181 | 12/1997 |
| JP | H10-051171 | 2/1998 |
| JP | 2000-207060 | 7/2000 |
| JP | 2004-259292 | 9/2004 |
| JP | 2004-292292 | 10/2004 |
| JP | 2007-180218 | 7/2007 |
| JP | 2007-328531 | 12/2007 |
| JP | 2008-016570 | 1/2008 |
| JP | 2008-028149 | 2/2008 |

(Continued)

OTHER PUBLICATIONS

Notice of Reasons for Rejection mailed by the Japan Patent Office on Oct. 26, 2010 in corresponding Japanese patent app. No. 2009-267822 in 6 pages.

(Continued)

*Primary Examiner* — Hung S Bui
(74) *Attorney, Agent, or Firm* — Knobbe, Martens, Olson & Bear LLP

(57) ABSTRACT

According to one embodiment, an electronic device includes a housing which has a shielding layer on its inner surface and is provided with an opening, a housed component which is contained inside the housing, and a module which is provided at the exterior of the housing, and has a first conducting section that is electrically connected to the housed component and a second conducting section that is different from the first conducting section. The electronic device includes a connection portion, and the connection portion has a contact portion and an elastic support portion which is extended to a part near the opening and supports the contact portion. The contact portion equalizes the potential of the shielding layer with the potential of the second conducting section by electrically connecting to the shielding layer by the opening, and contacting the second conducting section.

20 Claims, 9 Drawing Sheets

FOREIGN PATENT DOCUMENTS

| | | |
|---|---|---|
| JP | 2008-159636 | 7/2008 |
| JP | 2009-194031 | 8/2009 |
| JP | 2010-238746 | 10/2010 |

OTHER PUBLICATIONS

Notice of Reasons for Rejection mailed by the Japan Patent Office on Aug. 30, 2011 in corresponding Japanese patent app. No. 2009-267822 in 9 pages.

Notice of Reasons for Rejection mailed by the Japan Patent Office on Nov. 22, 2011 in Japanese patent app. No. 2011-224748 in 7 pages.

Japanese Office Action, for Corresponding Japanese Application No. 2011-224748, dated Apr. 17, 2012, in 5 pages.

Japanese Office Action for corresponding Japanese Application No. 2012-158440, mailed Oct. 16, 2012, in 11 pages.

* cited by examiner

ELECTRONIC DEVICE

CROSS-REFERENCE TO RELATED APPLICATIONS

This application is based upon and claims the benefit of priority from Japanese Patent Application No. 2009-267822, filed Nov. 25, 2009; the entire contents of which are incorporated herein by reference.

FIELD

Embodiments described herein relate generally to an electronic device which is provided with an electromagnetic shield.

BACKGROUND

Jpn. Pat. Appln. KOKAI Publication No. 2008-159636 discloses an electronic device in which a housing and a board are electronically connected via a conductive member. The electronic device comprises the housing in which a plurality of conductor patterns are provided, the board in which a wiring layer is provided on the surface, and the conductive member which connects the conductive patterns and the wiring layer.

The conductive member is a conductive elastic body made of conductive rubber or the like. By pressing a circuit board against the housing with the conductive member interposed therebetween, good electrical connection is secured.

However, in the above-mentioned conventional electronic device, since a conductive member is required, the number of components is increased, which increases the cost of manufacturing as a result.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, an electronic device includes a housing which has a shielding layer on its inner surface and is provided with an opening, a housed component which is contained inside the housing, and a module which is provided at the exterior of the housing, and has a first conducting section that is electrically connected to the housed component and a second conducting section that is different from the first conducting section. The electronic device includes a connection portion, and the connection portion has a contact portion and an elastic support portion which is extended to a part near the opening and supports the contact portion. The contact portion equalizes the potential of the shielding layer with the potential of the second conducting section by electrically connecting to the shielding layer by the opening, and contacting the second conducting section.

A first embodiment of an electronic device will now be described with reference to FIGS. 1 to 6. In the present specification, a front side (namely, a user's side) will be defined as front direction F, a back side seen from the user will be defined as rear direction R, a left side seen from the user will be defined as left direction, a right side seen from the user will be defined as right direction, an upper side seen from the user will be defined as upper direction, and a lower part seen from the user will be defined as lower direction.

Figure 1:
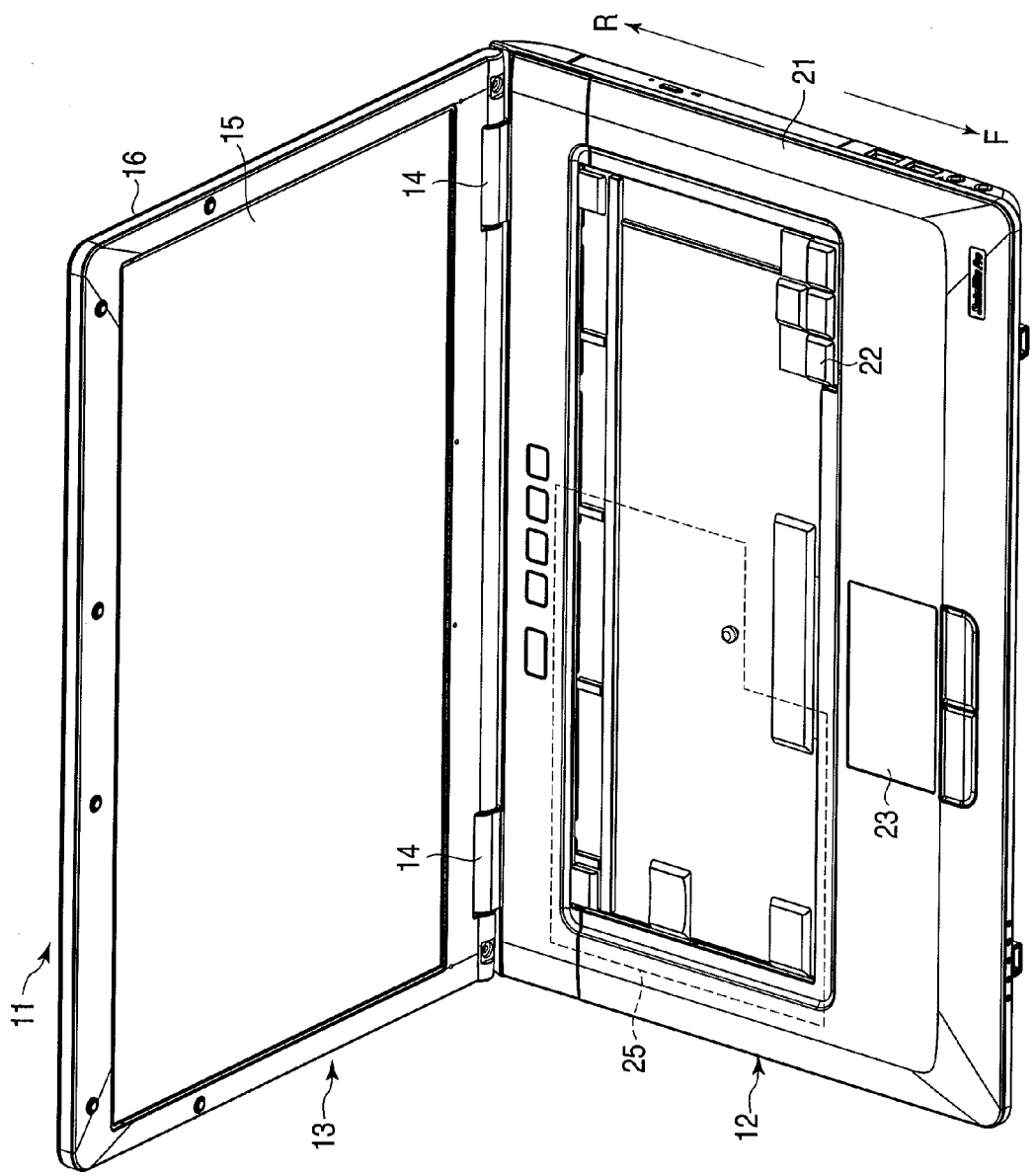
FIG. 1 is an exemplary perspective view of a portable computer according to a first embodiment.
Figure 2:
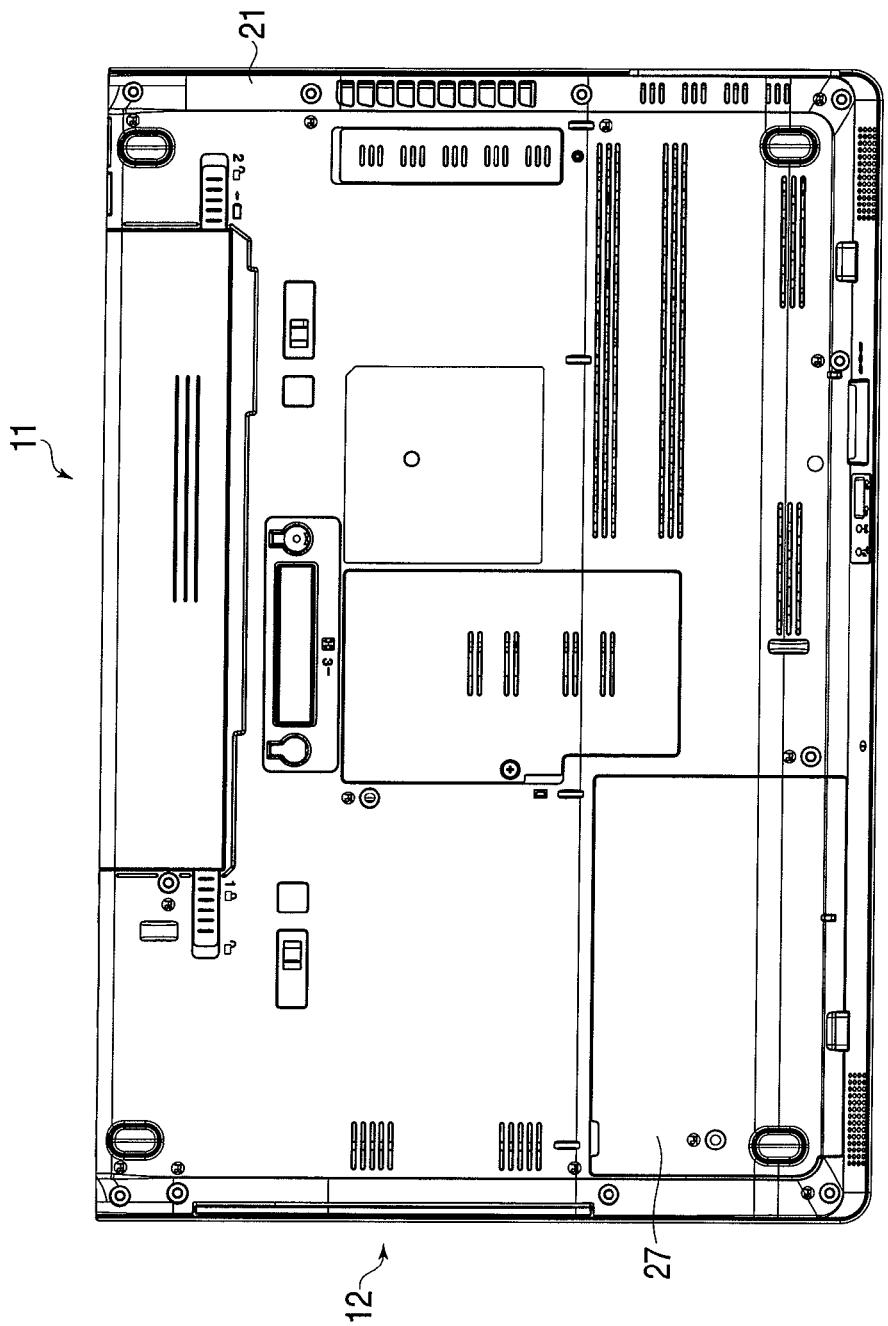
FIG. 2 is an exemplary bottom view which shows the portable computer shown in FIG. 1.
Figure 3:
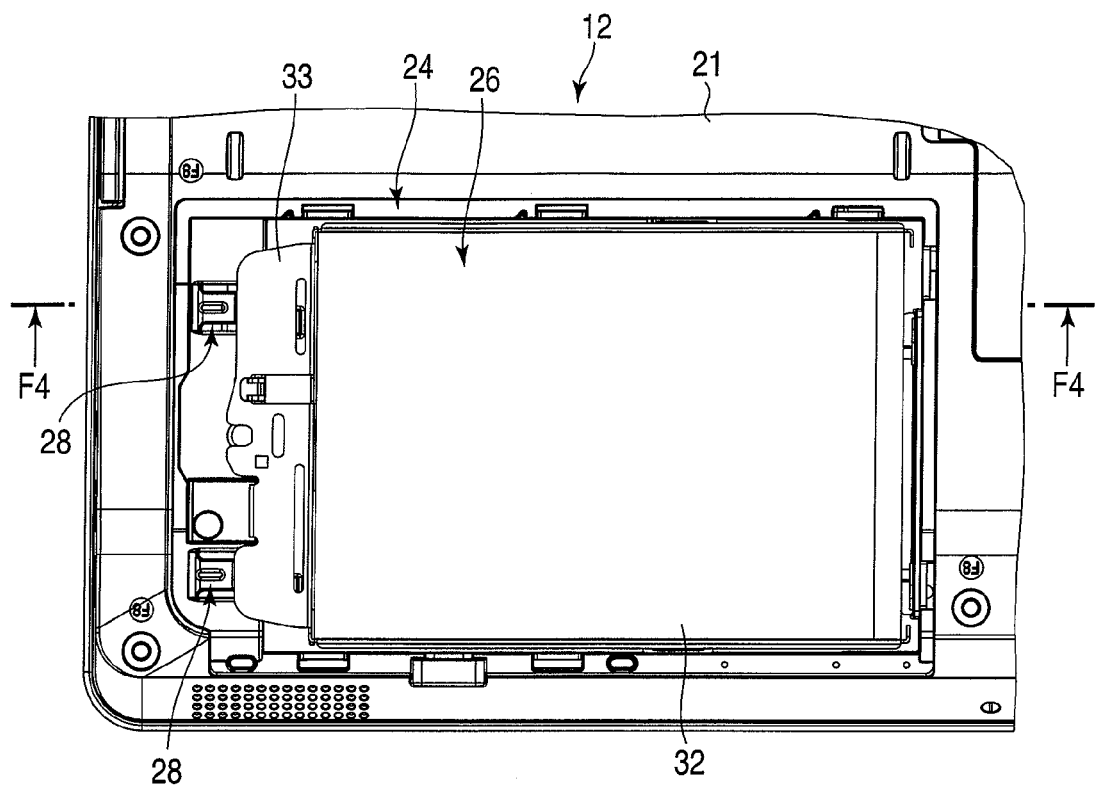
FIG. 3 is an exemplary bottom view which shows a state where a cover of the portable computer shown in FIG. 2 is removed.
Figure 4:
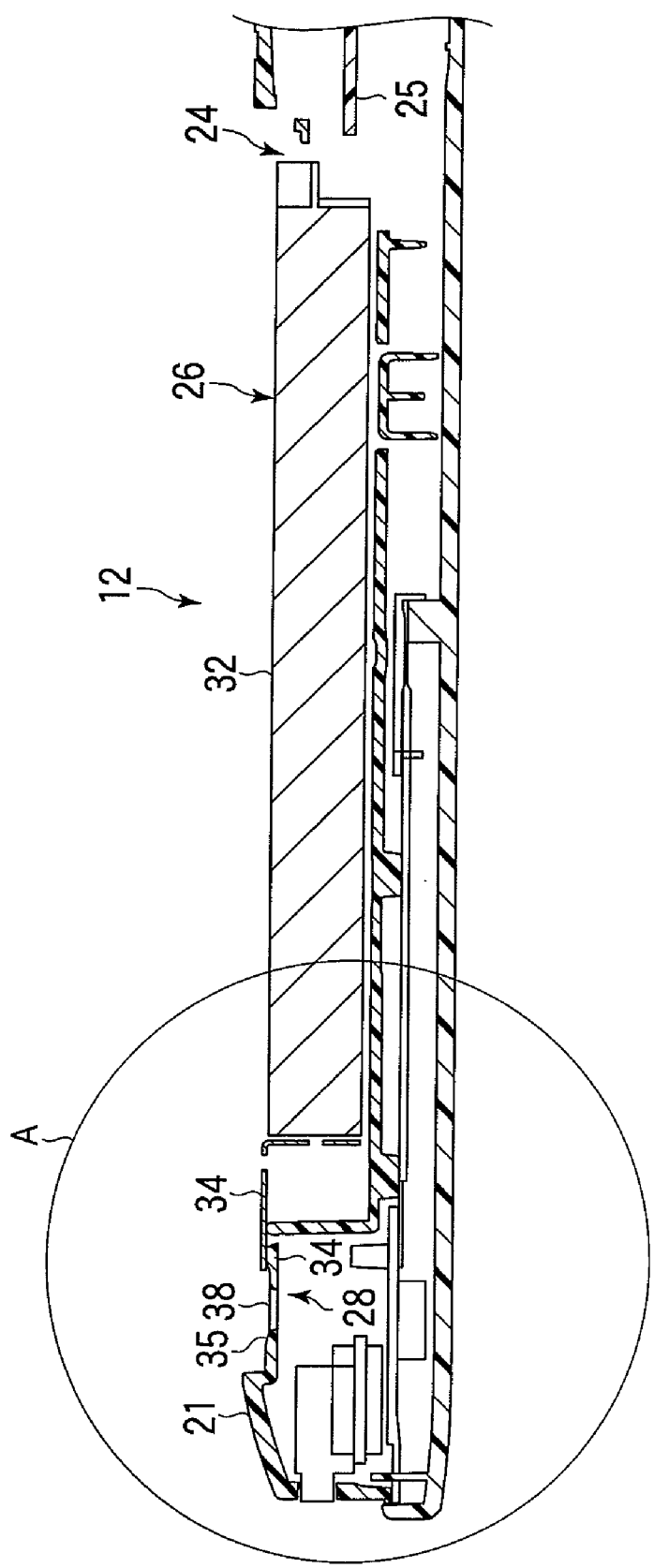
FIG. 4 is an exemplary sectional view of the portable computer shown in FIG. 3 taken along F4-F4 line.

As shown in FIG. 1, a portable computer 11, which is an example of an electronic device, comprises a main body unit 12, a display unit 13, and hinge sections 14 which are provided between the main body unit 12 and the display unit 13. The hinge sections 14 rotatably support the display unit 13.

The display unit 13 has a display 15 and a display cabinet 16 made of synthetic resin surrounding the periphery of the display 15. As an example of the display 15, in the present embodiment, a liquid crystal display is mounted.

As shown in FIGS. 1 to 4, the main body unit 12 has, for example, a main body cabinet 21 made of synthetic resin and formed to be box-shaped, a keyboard 22 and a touch pad 23 arranged on a top face of the main cabinet 21, a recess 24 formed at the bottom of the main body cabinet 21, a printed circuit board 25 housed in the main body cabinet 21, a hard disk drive (HDD) module 26, which is an example of a module to be fixed in the recess 24 of the main body cabinet 21, a cover 27 for covering the recess 24 which houses the HDD module 26, and a connection portion 28 which is formed at a part of the main body cabinet 21.

Figure 5:
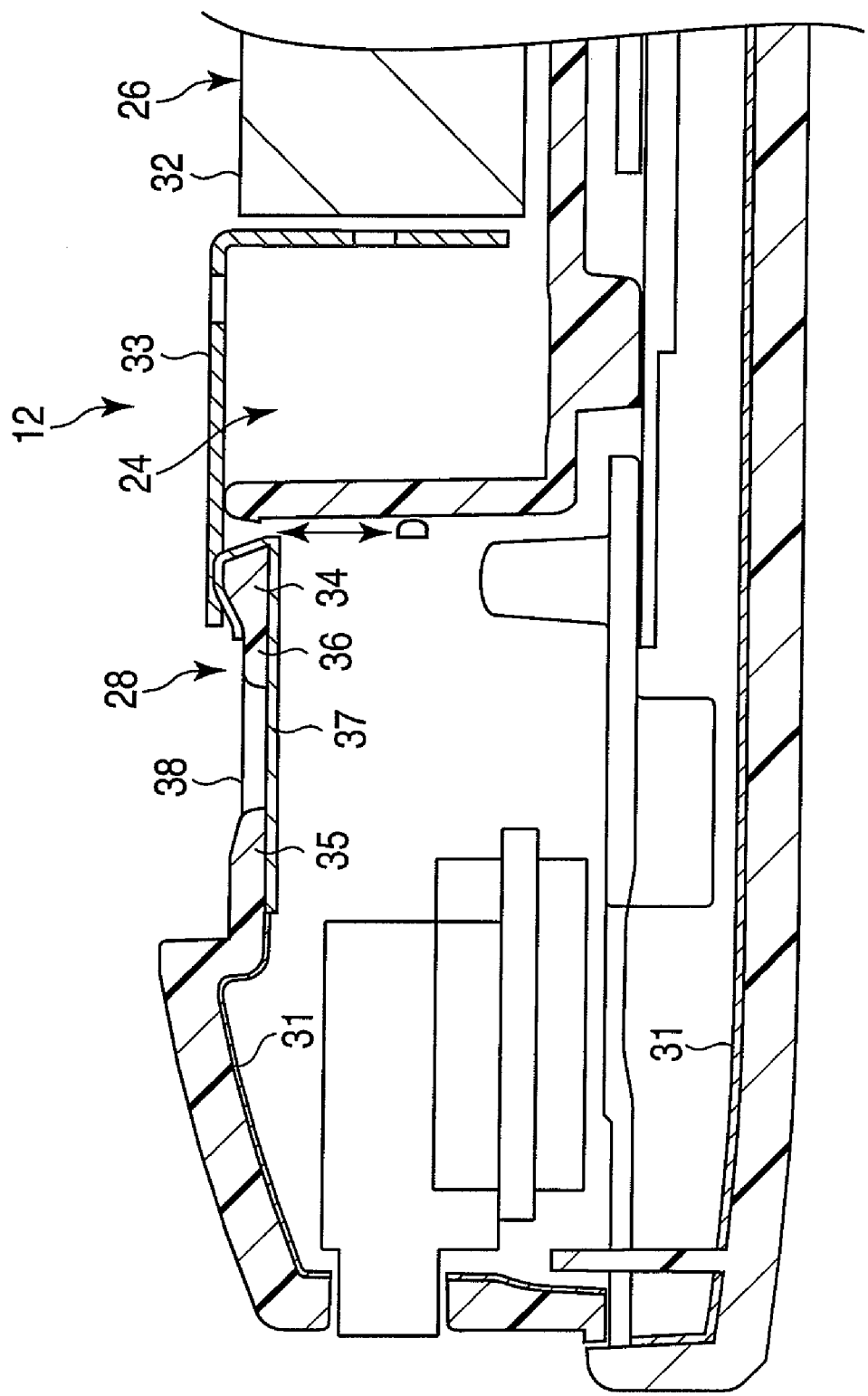
FIG. 5 is an exemplary enlarged sectional view of a portion indicated as A of the portable computer shown in FIG. 4.

As shown in FIG. 5, the main body cabinet 21 has a shielding layer 31, which is a metallic thin film, formed by a sputtering method, etc., on its inner surface. The shielding layer 31 prevents electromagnetic radiation generated by circuit components or the like inside the main body cabinet 21 from leaking outside through the main body cabinet 21 or, vice versa, prevents external electromagnetic radiation from adversely affecting the circuit components inside the main body cabinet 21.

The HDD module 26 is inside the recess 24, but strictly speaking, fixed to the exterior of the main body cabinet 21. The HDD module 26 is electrically connected to the printed circuit board 25, which is an example of the component housed in the main body cabinet 21. The printed circuit board 25 has a circuit component, such as a CPU. Further, a housing intended in the present invention has the concept including the main body cabinet 21 and the display cabinet 16.

As shown in FIGS. 3 to 6, the HDD module 26 can be mounted in an inner part of the recess 24 or removed from the inner part of the recess 24. The HDD module 26 has a second conducting section 32 which is formed by bending a metal plate to be box-shaped, an HDD unit housed in the second conducting section 32, and a mounting metal part 33, which is a first conducting section, arranged at the exterior of the second conducting section 32. The second conducting section 32 forms an outer shell of the HDD module 26.

The connection portion 28 and the main body cabinet 21 are integrally formed as one piece, and the connection portion 28 is extended to a part near an opening 29 of the main body cabinet 21, and projects like an arm. On the periphery of the connection portion 28, the opening 29 is provided. The connection portion 28 is projected into the opening 29. The connection portion 28 is electrically connected to the shielding layer 31 via the opening 29. The connection portion 28 extends in a direction parallel to the peripheral main body cabinet 21. The connection portion 28 is electrically conductive, and brought into elastic contact with the second conducting portion 32, thereby equalizing potentials of the second conducting portion 32 and the mounting metal part 33 with the potential of the shielding layer 31.

The connection portion 28 has a contact portion 34 which contacts the second conducting section 32 of the HDD module 26, and a support portion 35 which elastically supports the contact portion 34 at one end. The contact portion 34 is provided at a distal end of the connection portion 28.

Figure 6:
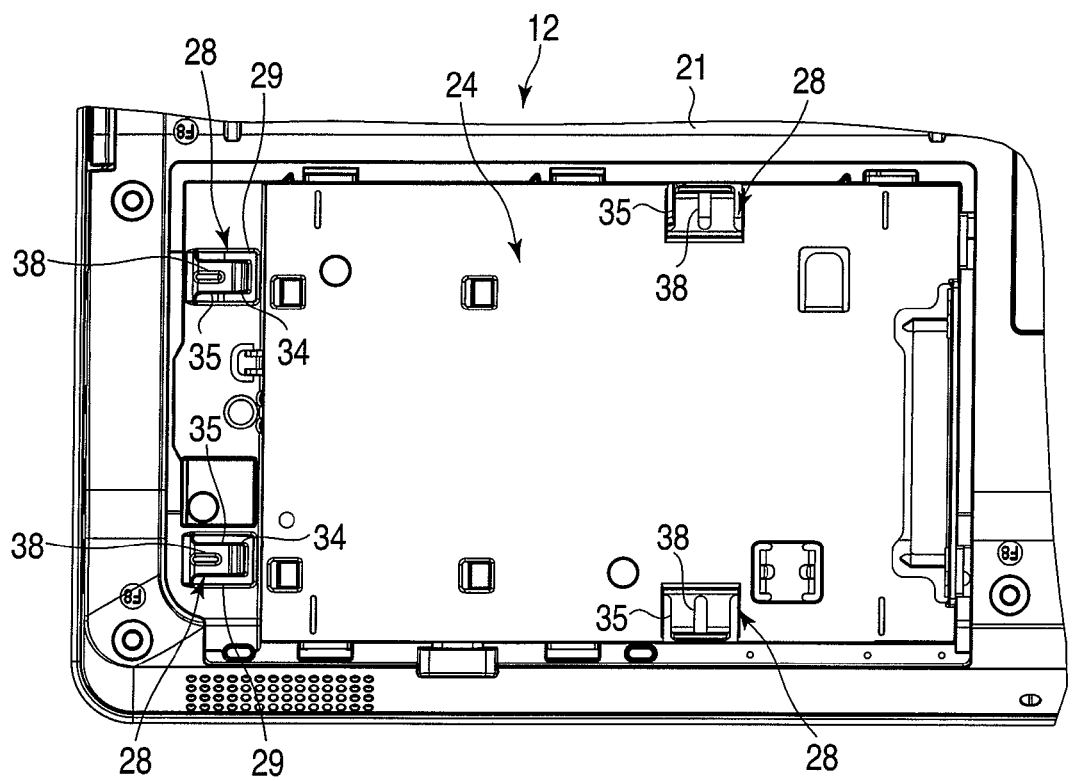
FIG. 6 is an exemplary bottom view which shows a state where an HDD module of the portable computer shown in FIG. 3 is removed.

The contact portion 34 is projected toward the second conduction section 32 at a position closer to the second conducting section 32 than the support portion 35 is. As shown in FIG. 5, the support portion 35 supports the contact portion 34 in such a way that the contact portion 34 can be moved in direction D which is substantially orthogonal to (which substantially crosses) a contact surface of the mounting metal part 33. Further, the connection portion 28 has a main body portion 36 made of synthetic resin, an electrically conductive coating layer 37 which surrounds the periphery of the main body portion 36, and a through-hole 38 which penetrates through the main body portion 36 in a thickness direction. As shown in FIG. 6, the through-hole 38 is formed as a long hole, and lengthened in a direction along a direction in which the connection portion 28 extends.

In the present embodiment, the coating layer 37 is formed by an aluminum sheet. The coating layer 37 grounds the second conducting section 32 of the HDD module 26 to the shielding layer 31 of the main body cabinet 21.

According to the first embodiment, the portable computer 11 comprises: a housing which has the shielding layer 31 on its inner surface and is provided with the opening 29; a housed component which is contained inside the housing; a module which is provided at the exterior of the housing, and has the first conducting section 33 that is electrically connected to the housed component and the second conducting section 32 that is different from the first conducting section 33; and the connection portion 28 which has the contact portion 34 that is electrically connected to the shielding layer 31 from the opening 29, and brought into contact with the second conducting section 32, thereby equalizing the potential of the shielding layer 31 with the potential of the second conducting section 32, and an elastic support portion 35 that is extended to a part near the opening 29 and supports the contact portion 34.

Since this structure enables the second conducting section 32 of the module to be grounded to the shielding layer 31 of the housing by the connection portion 28 provided at a part of the housing, it becomes unnecessary to separately provide a conductive member. Accordingly, it is possible to reduce the number of components, and cut the cost of manufacturing as a result.

The support portion 35 supports the contact portion 34 at one end in such a way that the contact portion 34 can be moved in direction D which is substantially orthogonal to (which substantially crosses) a contact surface of the second conducting section 32. By this structure, it is possible to realize a structure which elastically allows the contact portion 34 to contact the second conducting section 32 with an extremely simple construction.

The connection portion 28 has the main body portion 36 made of resin, and the electrically conductive coating layer 37 which covers the periphery of the main body portion 36. By this structure, it is possible to make the connection portion 28 electrically conductive and impart elasticity to the connection portion 28. The support portion 35 has the through-hole 38 which penetrates in its thickness direction, and the through-hole 38 extends in a direction in which the connection portion 28 extends. By this structure, it becomes possible to impart further elasticity to the support portion 35.

In the first embodiment, the support portion 35 is configured to support the contact portion 34 at one end, but is not limited to such a structure. That is, the support portion 35 may support the contact portion 34 at both ends as in a third embodiment.

Figure 7:
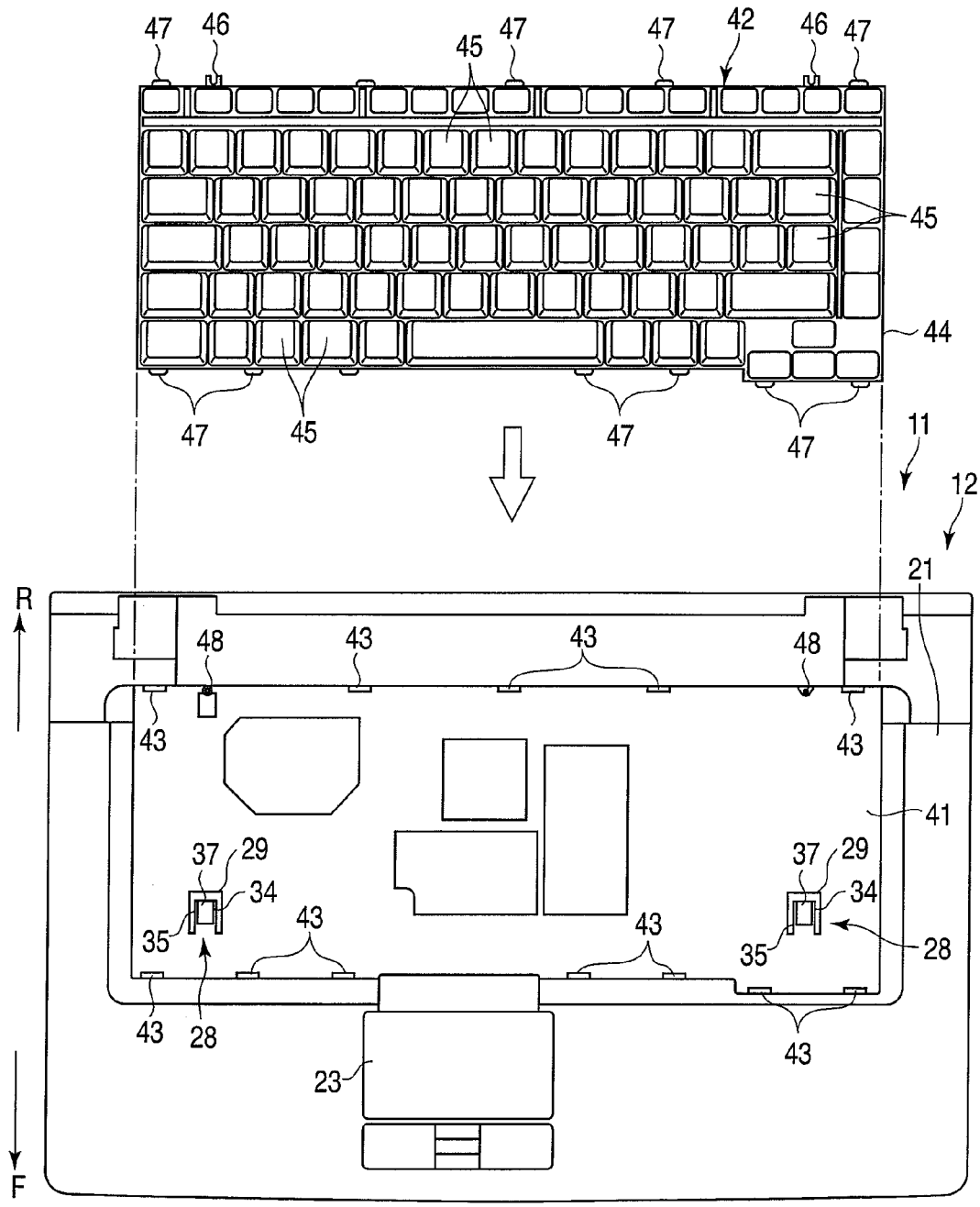
FIG. 7 is an exemplary top view which shows a state where a keyboard module of a portable computer according to a second embodiment is removed.

Next, a second embodiment of an electronic device will be described with reference to FIG. 7. A portable computer 11, which is an example of the electronic device according to the second embodiment, is different from the portable computer 11 of the first embodiment in that a type of a module and a position where it is installed are different, and that a position where a connection portion 28 is arranged is different. However, the other parts are in common with the parts of the first embodiment. Accordingly, an explanation will be given mainly for the different parts, and an explanation will be omitted for the common parts by assigning the same reference numerals thereto.

In the second embodiment, a main body unit 12 has a main body cabinet 21 which is made of synthetic resin and formed to be box-shaped, a mounting section 41 which is provided on a top face of the main body cabinet 21, a keyboard module 42, which is an example of a module to be fixed in the mounting section 41 of the main body cabinet 21, a printed circuit board 25 which is housed in the main body cabinet 21, and a connection portion 28 which is formed integrally as one piece with the main body cabinet 21.

The main body cabinet 21 has a shielding layer 31, which is a metallic thin film, formed by a sputtering method, etc., on its inner surface. The mounting section 41 is hollowed as compared to the periphery of the main body cabinet 21 and is flat. The mounting section 41 has insertion holes 43 into which nails 47 of the keyboard module 42 are inserted. The keyboard module 42 is fixed within the mounting section 41 and at the exterior of the main body cabinet 21.

The keyboard module 42 has a metallic and flat conducting section 44, and a plurality of keys 45 arranged on the conducting section 44. On the underside of the conducting section 44 with which the connection portion 28 makes contact, an aluminum sheet for further improving electrical conductivity is adhered. The conducting section 44 constitutes a support substrate of the keyboard module 42. The keyboard module 42 is electrically connected to the printed circuit board 25, which is an example of a housed component within the main body cabinet 21. The conducting section 44 has screw fixing portions 46 for fixing screws and the nails 47 for fixing the conducting section 44 to the mounting section 41. The screw fixing portion 46 are arranged at an end of the conducting section 44 in rear direction R.

The connection portion 28 has the form which is substantially the same as that of the first embodiment. That is, the connection portion 28 is projected like an arm from the mounting section 41 of the main body cabinet 21, and extends in a direction parallel to the peripheral mounting section 41. The connection portion 28 is projected into an opening 29. The connection portion 28 has a contact portion 34 which contacts the conducting section 44 of the keyboard module 42, and a support portion 35 which elastically supports the contact portion 34 at one end. The contact portion 34 is projected toward the conducting section 44 at a position closer to the conducting section 44 than the support portion 35 is. The support portion 35 supports the contact portion 34 in such a way that the contact portion 34 can be moved in a direction which is substantially orthogonal to (which substantially crosses) a contact surface of the conducting section 44. The connection portion 28 has a main body portion 36 which is made of synthetic resin, and an electrically conductive coating layer 37 which surrounds the periphery of the main body portion 36.

The connection portion 28 is arranged at a position corresponding to a screw hole 48 provided on the mounting section 41 of the main body cabinet 21. The connection portion 28 is provided at a position toward the front of the mounting section 41 in front direction F, which is near the insertion holes 43 of the mounting section 41.

In the present embodiment, the coating layer 37 is formed by an aluminum sheet. The coating layer 37 grounds the conducting section 44 of the keyboard module 42 to the shielding layer 31 of the main body cabinet 21. Similarly, the conducting section 44 of the keyboard module 42 is grounded to the screw holes 48 that are electrically connected to the shielding layer 31 via screws fixed in the screw fixing portions 46.

According to the second embodiment, a module is comprised of the keyboard module 42. Accordingly, by grounding the keyboard module 42 to the shielding layer 31 of the main body cabinet 21, it is possible to prevent unnecessary electromagnetic radiation from the keyboard module 42 from being emitted.

In the second embodiment, the support portion 35 supports the contact portion 34 at one end, but is not limited to this structure. The support portion 35 may be the one which supports the contact portion 34 at both ends as in a third embodiment.

Figure 8:
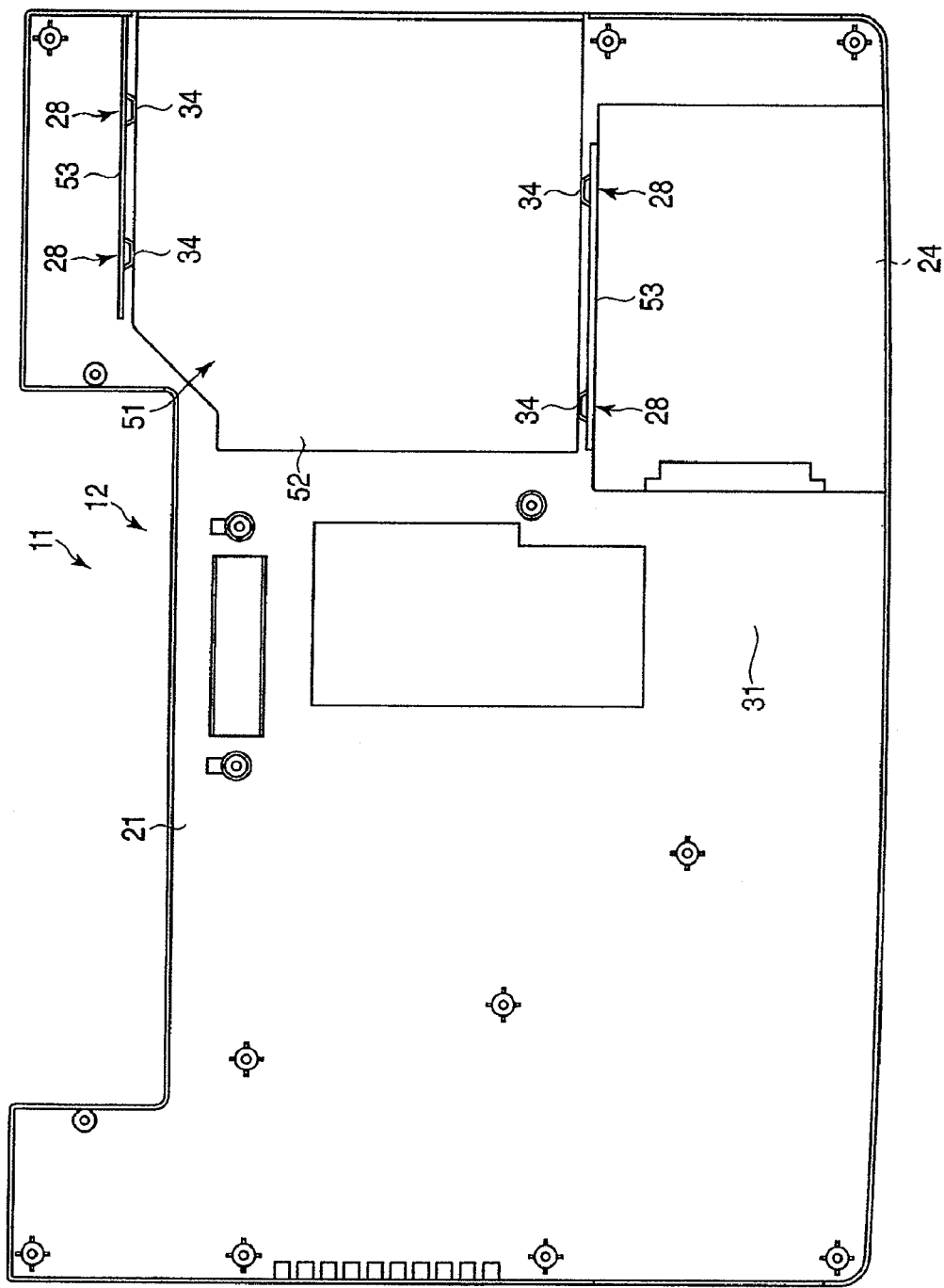
FIG. 8 is an exemplary top view which shows a main body cabinet, an ODD module, and a connection piece of a portable computer according to a third embodiment.
Figure 9:
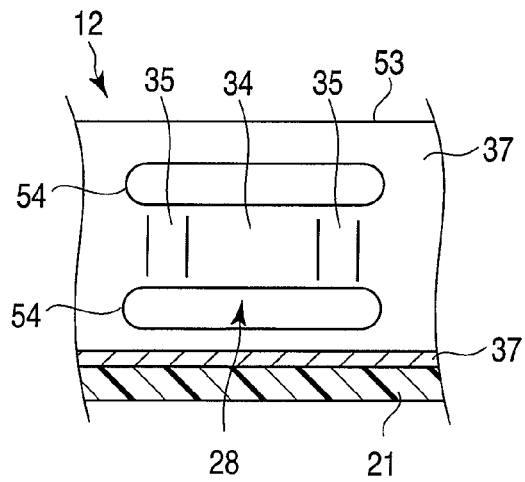
FIG. 9 is an exemplary enlarged front view of a connection piece of a portable computer shown in FIG. 8.

The third embodiment of an electronic device will now be described with reference to FIGS. 8 to 10. A portable computer 11, which is an example of the electronic device according to the third embodiment, is different from the portable computer 11 of the first embodiment in that a type of a module and a position where it is installed are different, and that a position where a connection portion 28 is arranged is different. However, the other parts are in common with the parts of the first embodiment. Accordingly, an explanation will be given mainly for the different parts, and an explanation will be omitted for the common parts by assigning the same reference numerals thereto.

In the third embodiment, a main body unit 12 has a main body cabinet 21 which is made of synthetic resin and formed to be box-shaped, an optical disk drive (ODD) module 51, which is an example of a module housed in the main body cabinet 21, a printed circuit board 25 which is housed in the main body cabinet 21, and a connection portion 28 which is formed at a part of the main body cabinet 21. The main body cabinet 21 includes an upper case to which a keyboard 22 and a touch pad 23 are fixed, and a lower case in which a recess 24 is provided. FIG. 8 shows only the lower case of the main body cabinet 21.

The main body cabinet 21 has a shielding layer 31, which is a metallic thin film, formed by a sputtering method, etc., on its inner surface.

The ODD module 51 has a conducting section 52 which is formed by bending a metal plate to be box-shaped, and an ODD unit which is housed in the conducting section 52. The conducting section 52 forms an outer shell of the ODD module 51. The ODD module 51 is fixed inside the main body cabinet 21. The ODD module 51 is electrically connected to the printed circuit board 25, which is an example of a housed component within the main body cabinet 21.

Figure 10:
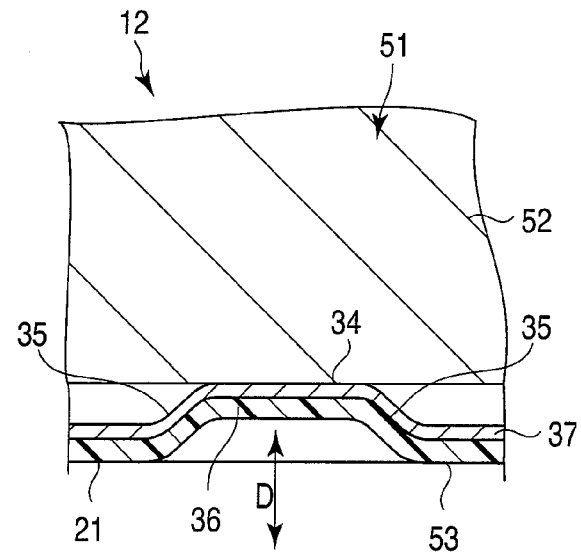
FIG. 10 is an exemplary enlarged sectional view of the connection piece of the portable computer shown in FIG. 9.

As shown in FIG. 10, the connection portion 28 is integrally formed as one piece with the main body cabinet 21, and projected like a trapezoid from a rib wall 53 raised from a bottom wall of the main body cabinet 21. The connection portion 28 has a contact portion 34 which contacts the conducting section 52 of the ODD module 51, and a support portion 35 which supports the contact portion 34 at both ends.

The support portion 35 elastically supports the contact portion 34 in such a way that the contact portion 34 can be moved in direction D which is substantially orthogonal to (which substantially crosses) a contact surface of the conducting section 52. Further, the connection portion 28 has a main body portion 36 made of synthetic resin, and an electrically conductive coating layer 37 which surrounds the periphery of the main body portion 36. At places adjacent to the connection portion 28, upper and lower oval slits extending parallel to each other, are provided, which enhances elasticity of the contact portion 34 and the support portion 35.

In the present embodiment, the coating layer 37 is made of a metallic thin film, which is formed by a sputtering method, etc., just like the shielding layer 31, and is continuous with the shielding layer 31. The coating layer 37 grounds the conducting section 52 of the ODD module 51 to the shielding layer 31 of the main body cabinet 21.

According to the third embodiment, the portable computer 11 comprises: a housing which has the shielding layer 31 on its inner surface; a housed component which is contained inside the housing; a module which is provided within the housing and has the conducting section 52 electrically connected to the housed component; and the connection portion 28 which has the contact portion 34 that is electrically connected to the shielding layer 31 and brought into contact with the conducting section 52, thereby equalizing the potential of the shielding layer 31 with the potential of the conducting section 52, and the support portion 35 that supports the contact portion 34.

By such a structure, even if a module is contained inside the housing, it is possible to securely ground the conducting section 52 of the module to the shielding layer 31 of the housing by the connection portion 28 provided at a part of the housing. Accordingly, there is no need to separately provide a conductive member, and it is possible to cut the manufacturing cost.

The connection portion 28 has the contact portion 34 which contacts the conducting section 52, and the support portion 35 which supports the contact portion 34 at both ends to be movable in direction D which is substantially orthogonal to (which substantially crosses) a contact surface of the conducting section 52. With the above configuration, it is possible to realize a structure that can move the contact portion 34 while maintaining greater durability.

In the third embodiment, the support portion 35 is configured to support the contact portion 34 at both ends. However, the support portion 35 is not limited to the above structure, and may support the contact portion 34 at one end as in the first embodiment. Further, in the present embodiment, although the coating layer 37 is made of a metallic thin film which is formed by a sputtering method, etc., it is not limited to the above and may be structured by an aluminum sheet, for example.

Figure 11:
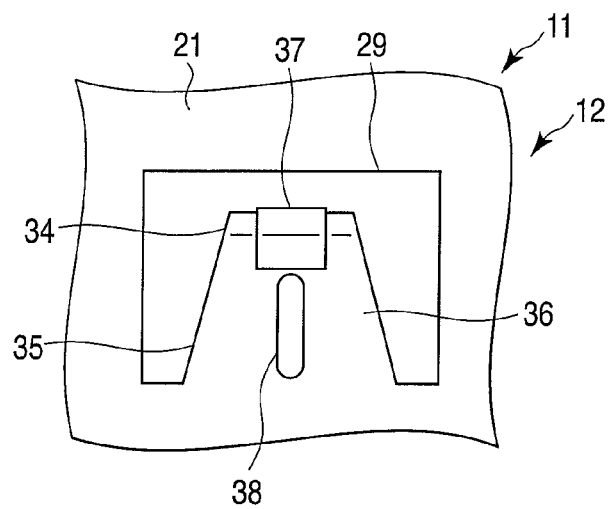
FIG. 11 is an exemplary top view which shows a connection piece of a modification of the portable computer according to the first to the third embodiments.

A modification of the first to third embodiments of the electronic device will now be described with reference to FIG. 11. The electronic device of the modification is different from the electronic device of the first to third embodiment in that the form of the connection portion 28 is different. However, the other parts are in common with the parts of the first to third embodiments. Accordingly, an explanation will be given mainly for the different point, and an explanation will be omitted for the common parts by assigning the same reference numerals thereto.

In the present modification, the width of the connection portion 28 is narrowed toward a distal end. Accordingly, by the present modification, it is possible to further improve flexibility in the support portion 35 as compared to the case of the connection portion 28 of the first to third embodiments. By virtue of this feature, even if an impact is externally applied to the main body cabinet 21, as in the case where the portable computer 11 is dropped, it is possible to improve reliability of connection between the conducting sections 32, 44, and 52 of a module and the shielding layer 31 of the main body cabinet 21 without damaging the connection portion 28.

The electronic device of the present invention is not limited to the portable computer 11 indicated in the above-mentioned embodiments, and may be embodied as other types of electronic devices, such as a cellular phone. Further, in the first to third embodiments stated above, an aluminum sheet is used as the coating layer 37. However, the coating layer 37 is not limited to above, and may be any type of structure as long as it can ground the conducting sections 32, 44, and 52 of the module to the shielding layer 31 of the housing. That is, the coating layer 37 can be made of a metallic thin film which is formed by a sputtering method, etc. Needless to say, the electronic device can be modified in various manners to be implemented without departing from the spirit of the invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The various modules of the systems described herein can be implemented as software applications, hardware and/or software modules, or components on one or more computers, such as servers. While the various modules are illustrated separately, they may share some or all of the same underlying logic or code. The accompanying claims and their equivalents are intended to cover such forms or modifications as would fall within the scope and spirit of the inventions.

What is claimed is:

1. An electronic device comprising:
   a housing comprising a shielding layer on its inner surface and a recess;
   a module comprising a second conducting portion, and a first conducting portion outside the second conducting portion and electrically connected to the second conducting portion, and housed in the recess;
   a connector comprising a contact portion contacting the first conducting portion, and an elastic support portion supporting the contact portion, and integral with the housing; and
   a coating layer formed of an electrically conductive sheet, the coating layer being electrically connected to the shielding layer and configured to cover a surface of the connector and equalize the potential of the first conducting portion with the potential of the shielding layer.

2. The electronic device according to claim 1, wherein the second conducting portion comprises a metal outer shell portion covering the module, and the first conducting portion comprises a metal part on the second conducting portion.

3. The electronic device according to claim 1, wherein the support portion is configured to support the contact portion at a first end which allows the contact portion to move in a direction intersecting a contact surface of the first conducting portion.

4. The electronic device according to claim 1, wherein the support portion comprises a through-hole in a thickness direction of the support portion, and through-hole is extending along with the connector.

5. The electronic device according to claim 1, wherein the connector is narrower toward a distal end.

6. The electronic device according to claim 1, wherein the electronic device comprises a portable computer including a main body unit, a display unit, and hinge sections between the main body unit and the display unit, and the hinge sections rotatably support the display unit.

7. The electronic device according to claim 1, wherein the main body unit comprises the housing which is made of synthetic resin and box-shaped, a keyboard and a touch pad on top of the housing, the recess at the bottom of the housing, a printed circuit board within the housing, a cover for covering the recess which houses the module, and the connector at a part of the housing.

8. The electronic device according to claim 1, wherein the connector is extended to a part near an opening of the housing and projects like an arm.

9. The electronic device according to claim 1, wherein an opening is provided on the periphery of the connector, and the connector projects into the opening and is electrically connected to the shielding layer via the opening.

10. The electronic device according to claim 1, wherein the connector extends in a direction parallel to the peripheral housing.

11. The electronic device according to claim 1, wherein the support portion is configured to support the contact portion at a first end which allows the contact portion to move in a direction intersecting a contact surface of the first conducting portion.

12. The electronic device according to claim 1, wherein the support portion is configured to support the contact portion at first and second ends.

13. The electronic device according to claim 1, wherein the connector is configured to project like an arm from a peripheral mounting section, and extend in parallel to the mounting section.

14. The electronic device according to claim 1, wherein the contact portion projects toward the first conducting portion and the second conducting portion, and is closer to the first conducting portion and the second conducting portion than the support portion is.

15. The electronic device according to claim 1, wherein the connector is projected from a rib wall raised from a bottom wall of the housing.

16. The electronic device according to claim 1, wherein the module comprises an HDD housed in the housing.

17. The electronic device according to claim 1, wherein the support portion is configured to support the contact portion at both ends.

18. The electronic device according to claim 1, wherein the connector comprises the contact portion contacting the first conducting portion of the module, and the support portion elastically supporting the contact portion at a first end.

19. The electronic device according to claim 1, wherein the module is electrically connected to a printed circuit board in the housing, and the printed circuit board comprises a circuit component comprising a CPU.

20. The electronic device according to claim 1, wherein the housing comprises a main body cabinet and a display cabinet.

* * * * *